United States Patent [19]

Norman

[11] Patent Number: 5,359,243
[45] Date of Patent: Oct. 25, 1994

[54] FAST TTL TO CMOS LEVEL CONVERTING BUFFER WITH LOW STANDBY POWER

[75] Inventor: Kevin A. Norman, San Mateo, Calif.

[73] Assignee: Altera Corporation, San Jose, Calif.

[21] Appl. No.: 49,694

[22] Filed: Apr. 16, 1993

[51] Int. Cl.[5] ............... H03K 19/0175; H03K 19/094
[52] U.S. Cl. .................................. 307/475; 307/443; 307/448
[58] Field of Search ................ 307/475, 451, 448, 443

[56] References Cited

U.S. PATENT DOCUMENTS

| | | | |
|---|---|---|---|
| 4,501,978 | 2/1985 | Gentile et al. | 307/475 |
| 4,675,544 | 6/1987 | Schrenk | 307/475 |
| 4,697,101 | 9/1987 | Iwahashi et al. | 307/443 |
| 4,763,022 | 8/1988 | Sheldon | 307/475 |
| 4,845,381 | 7/1989 | Cuevas | 307/290 |
| 4,956,567 | 9/1990 | Hunley et al. | 307/310 |
| 5,065,361 | 11/1991 | Yoshizawa et al. | 307/475 |
| 5,144,167 | 9/1992 | McClintock | 307/475 |

FOREIGN PATENT DOCUMENTS

| | | | |
|---|---|---|---|
| 60-139020 | 7/1985 | Japan | 307/475 |
| 4-268818 | 9/1992 | Japan | 307/475 |

*Primary Examiner*—Edward P. Westin
*Assistant Examiner*—Jon Santamauro
*Attorney, Agent, or Firm*—Townsend and Townsend Khourie and Crew

[57] ABSTRACT

A fast TTL to CMOS level converting circuit with reduced standby current is disclosed. A fast first stage CMOS inverter with skewed transistor size ratios is isolated from a large load capacitance by a second inverter. The second inverter connects to the power supply through a depletion mode NMOS transistor. The gate terminal of the depletion mode NMOS transistor is driven by the output of the first inverter. The depletion NMOS disconnects the PMOS transistor of the second inverter from the power supply when the input voltage ranges between the power supply and 2.0 volts, resulting in zero standby current for the second stage. Therefore, the second stage can be made large enough to drive large fanout capacitances without incurring additional standby current.

3 Claims, 3 Drawing Sheets

FAST TTL TO CMOS LEVEL CONVERTING BUFFER WITH LOW STANDBY POWER

BACKGROUND OF THE INVENTION

The present invention relates in general to voltage level converter circuits, and in particular to a fast TTL to CMOS level converter circuit with low standby current.

The voltage levels for a logic high and a logic low are different in TTL circuits as compared to CMOS circuits. Therefore, CMOS logic circuits require voltage converting buffers at their inputs to be able to accept TTL signals. In most CMOS designs the input buffer is a CMOS inverter with an otherwise unusual PMOS to NMOS channel width ratio of from 1:3 to as much as 1:8. This ratio skews the inverter trip point to around 1.4 volts such that when the input voltage is 2.0 volts (TTL logic high) the output is near ground (CMOS logic low), and when the input voltage is 0.8 volts (TTL logic low) the output is near the power supply $V_{cc}$ (CMOS logic high).

Because the PMOS transistor is inherently weaker than the NMOS transistor, to obtain optimal speed, typical CMOS inverters use a PMOS to NMOS transistor size ratio of approximately 2:1. Therefore, when the ratio of the transistor sizes in a CMOS inverter is skewed such that the PMOS transistor is further weakened, the inverter slows down significantly when it is used to drive a large capacitive load. One way to speed up the inverter is to scale up the widths of both the N and PMOS transistors. However, this results in large amounts of current through the inverter when the input is at 2 volts (the TTL input high voltage termed $V_{ih}$) and both transistors are on. Therefore, power dissipation requirements place a limit on the size of the transistors.

A second technique to speed up the buffer inverter is to limit its capacitive loading. This is accomplished by adding a chain of inverters, each with increasing size to build up to an adequate power level to drive the internal fanouts of the input signal. This way the first inverter with skewed transistor size ratio drives the gate of the succeeding inverter only. This solution is typical of current design practices. However, since each inverter in the chain has a finite delay to pass the input signal, the inverter chain results in additional delays.

During the early development of the MOS technology, depletion mode NMOS transistors where used as load devices in MOS circuit designs. By implanting n-type impurities in the channel region of an enhancement mode NMOS device, a strongly conducting channel can be obtained even with a gate to source voltage ($V_{gs}$) of zero. The resulting NMOS transistor is called a depletion device, and typically has threshold voltage $V_{td}$ in the range of $-1$ to $-4$ volts.

Using depletion devices as load transistors, a popular buffering technique known as the "depletion-depletion super buffer" was frequently used to drive large fanout capacitances. FIG. 1 shows a typical depletion-depletion super buffer circuit. This circuit has the advantage of being twice as fast as a conventional one stage depletion NMOS inverter when the output is rising, and about 10% faster when the output is falling. This is due to the fact that for a single stage depletion load inverter, the gate of the diodeconnected depletion device is connected to the output of the inverter (also the source of the depletion device) which could be slow when driving a large capacitive load. In the case of the two stage supper buffer of FIG. 1, the gate of sourcefollower depletion load 110 of the second stage is driven by the output of the first stage, node 100, which rises to $V_{cc}$ at a much faster rate due to the limited capacitance on node 100. This allows the output at the source terminal of depletion device 110 to rise to $V_{cc}$ at a faster rate.

The major drawback of the super buffer is large power dissipation. When the input is high and the output is low, the super buffer circuit dissipates large amounts of current. For this reason, super buffers were only used when they were truly required.

Taken individually, each of the above circuit techniques pays too high a power dissipation price for the respective speed improvement gained.

From the above it can be seen that there is a need for a high speed voltage level converting circuit capable of driving large capacitive loads while dissipating small standby current.

SUMMARY OF THE INVENTION

The present invention provides a fast TTL to CMOS voltage level converting circuit that can drive a large capacitive load with small standby current. The invention combines the essential speed benefit of the super buffer technique with a novel mechanism for eliminating standby current.

In a preferred embodiment, the present invention provides a CMOS voltage level converting circuit comprising a first inverter stage that receives an input signal at its input; a second inverter stage also receiving the input signal at its input; and a depletion mode transistor coupling the second inverter stage to the power supply and driven by an output of the first inverter stage.

The transistor sizes in the first inverter stage are designed to be small yet in the same 1:3 width ratio typical of TTL to CMOS buffers used in the current art. Small transistors sizes maintain the power dissipation in the first stage at a minimum. At the same time, an output of the first inverter stage drives the depletion transistor such that for input voltages greater than the threshold of the first inverter stage (about 1.4 V), the depletion transistor debiases the second inverter into a zero current state. The second stage therefore, does not consume standby current for input voltages at or below 0.8 V or at or above 2.0 V. This allows for scaling up the transistor sizes of the second stage to drive a very large fanout capacitance, which in turn reduces delay without incurring additional current.

A further understanding of the nature and advantages of the circuit of the present invention may be gained with reference to the description and diagrams below.

DESCRIPTION OF THE PREFERRED EMBODIMENT

Figure 2:
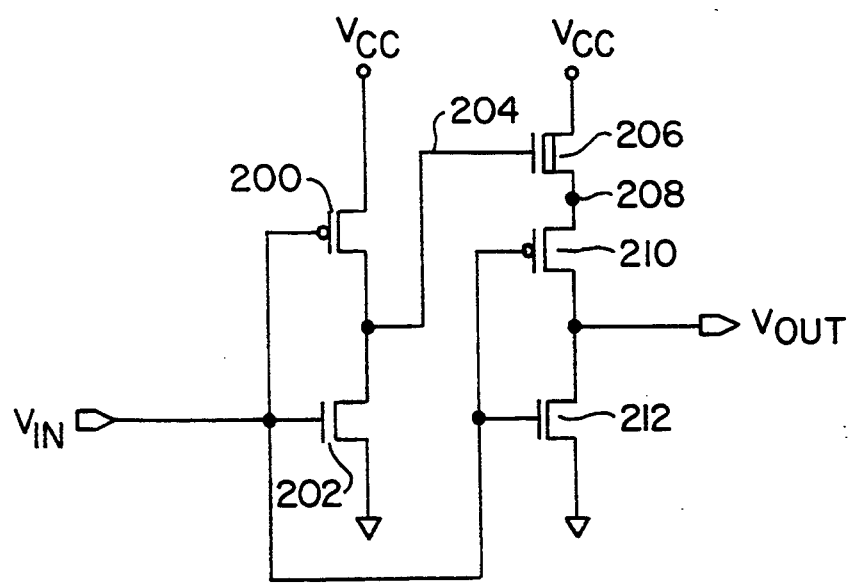
FIG. 2 is a circuit schematic of a preferred embodiment of the level converting circuit of the present invention.

FIG. 2 is a circuit schematic of the preferred embodiment of the voltage level converting circuit of the present invention. A first CMOS inverter stage made up of PMOS 200 and NMOS 202 receives the TTL input signal at its input terminal $V_{in}$. The input signal also connects to the input of a second CMOS inverter stage made up of PMOS 210 and NMOS 212. Instead of connecting directly to power supply $V_{cc}$, the source terminal of PMOS 210 of the second inverter stage (node 208) connects to $V_{cc}$ through a depletion NMOS 206. The output of the first inverter stage, node 204, drives the gate terminal of the depletion NMOS 206. The output of the second inverter stage connects to the circuit output $V_{out}$.

Figure 1:
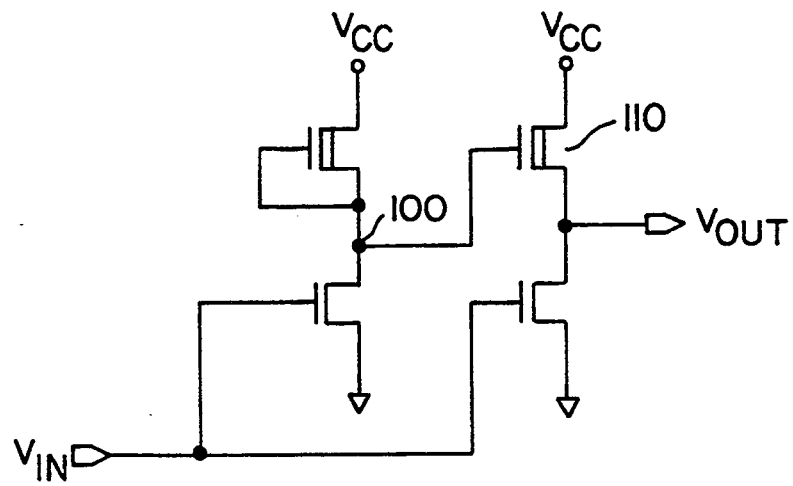
FIG. 1 is a circuit schematic of a typical depletion-depletion super buffer.
Figure 3:
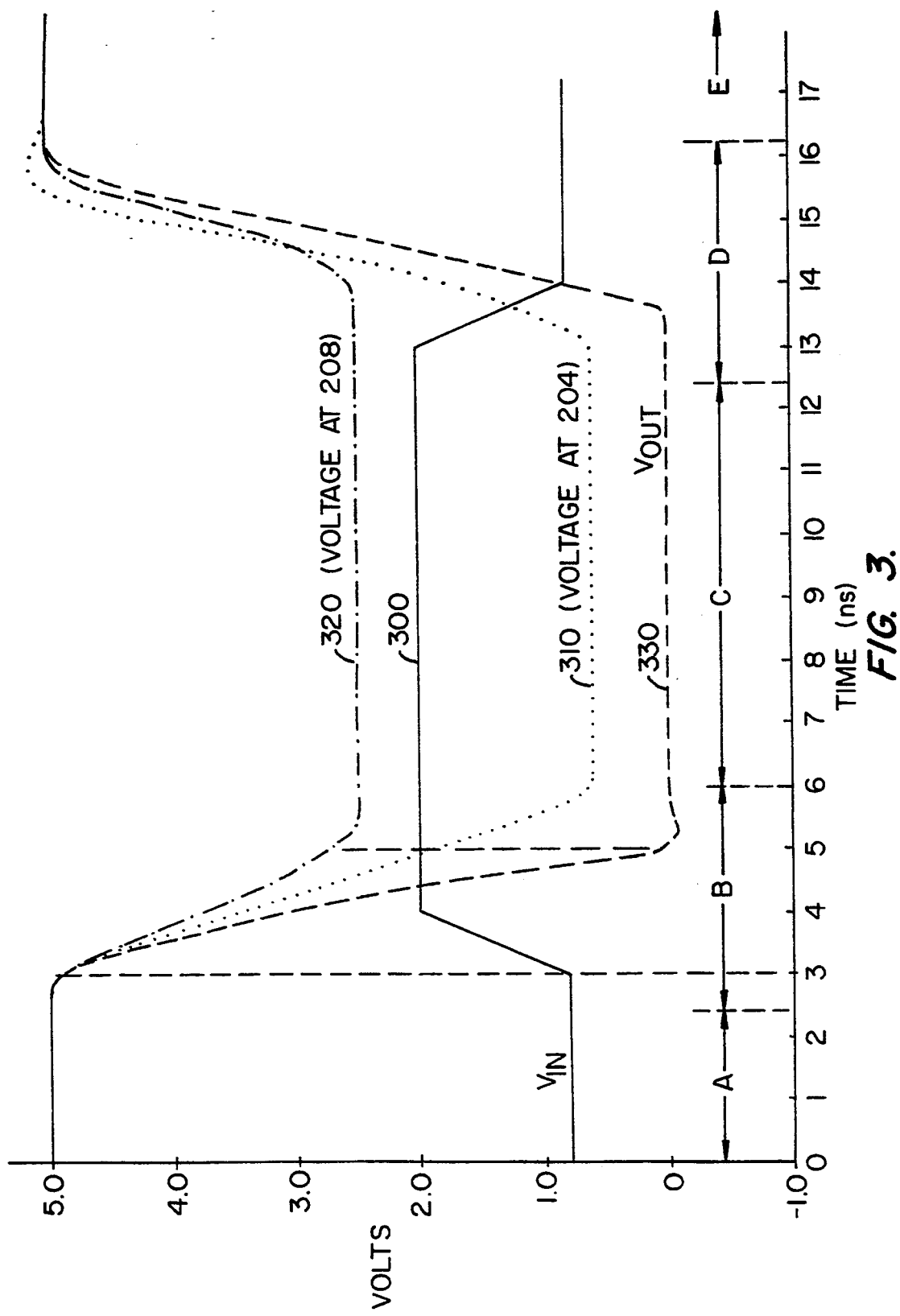
FIG. 3 is a timing diagram illustrating the operation of the level converting circuit of the present. invention.

FIG. 3 is a timing diagram illustrating the operation of the circuit of FIG. 1 while driving a capacitive load. The operation of the preferred embodiment of the level converting circuit will be described in connection with five time periods marked as A, B, C, D, and E in FIG. 3. Curves 300, 310, 320, and 330 correspond to the voltages at the input, node 204, node 208, and the output respectively.

For the purposes of this description assume threshold voltages of $Vtn = 1.0$ V, $V_{tp} = -1.0$ V and $V_{td} = -1.5$ V for NMOS, PMOS and depletion NMOS transistors, respectively. When the input voltage is between 0 V and 0.8 V (i.e. TTL low), NMOS 202 is off since its gate to source voltage is less than its threshold voltage. On the other hand, PMOS 200 is strongly conducting pulling node 204 up to $V_{cc}$. The gate of depletion NMOS 206 is therefore at $V_{cc}$ pulling node 208 up to $V_{cc}$. Similar to the first inverter stage, NMOS 212 is off while PMOS 210 is strongly conducting. Therefore, $V_{out}$ is pulled up to $V_{cc}$ (i.e. CMOS logic high). This corresponds to time period A in FIG. 3 showing curve 300 ($V_{in}$) at 0.8 V and all other nodes at 5.0 V ($V_{cc}$).

As the input voltage rises from 0.8 V to 2.0 V, NMOS 202 begins to conduct, while the conductance of PMOS 200 is simultaneously reduced. This pulls the voltage at node 204 down toward ground. With depletion NMOS 206 acting as a source-follower, the voltage at node 208 follows the voltage at node 204 down with an offset of +1.5 V. As the input voltage at the gate of PMOS 210 rises and the voltage at node 208 (source terminal of PMOS 210) falls, the conduction of PMOS 210 is rapidly reduced. When the voltage at node 208 falls to within 1.0 V ($-Vtp$) above the input voltage, PMOS 210 cuts off. At the same time, NMOS 212 is conducting strongly, rapidly discharging the output $V_{out}$ to ground. By so debiasing PMOS 210 into the cut off region, the current consumption of the second stage drops to zero even though the input voltage is at 2.0 V. Time period B in FIG. 3 shows the signals during this transition period. A transition on the input voltage signal 300 from 0.8 V (TTL low) to 2.0 V (TTL high) results in a transition on the output voltage signal 330 from 5.0 V (CMOS logic high) to 0.0 V (CMOS logic low).

Time period C in FIG. 3 shows the voltage levels on all nodes when the input voltage is at 2.0 V. If the input voltage rises to above $V_{cc} + V_{tp}$ (i.e. 4.0 V, not shown), PMOS 200 of the first inverter stage cuts off and NMOS 202 turns on strongly. The voltage at node 204 falls to 0 V, and consequently the voltage at node 208 can be no higher than 1.5 V (one $V_{td}$) at which point the drain current of depletion NMOS 206 drops to zero. With 1.5 V at its source terminal and $V_{cc} + V_{tp}$ at its gate, PMOS 210 cuts off while NMOS 212 conducts strongly. The output $V_{out}$ is therefore at 0 V. For this input voltage range neither of the two stages conduct any current.

As the input voltage drops from $V_{cc} + V_{tp}$ down toward 2.0 V, PMOS 200 starts conducting. The first inverter stage has skewed transistor size ratios as in typical TTL to CMOS level converters. With a PMOS 200 to NMOS 202 size ratio of, for example, 1:3, the voltage at node 204 is maintained near 0 V even though PMOS 200 is conducting. Under these conditions therefore, both PMOS 200 and NMOS 202 conduct. However, depletion NMOS 206 has 0 V on its gate, so the voltage at node 208 can be no higher than 1.5 V. PMOS 210 cuts off while NMOS 212 conducts, pulling $V_{out}$ down to 0 V. As a result, for this range of input voltages ($V_{cc}$ to 2.0 V) only the first stage consumes standby power. The second inverter can therefore be made large to drive larger capacitive loads without incurring additional currents.

Time period D in FIG. 3 shows the input voltage falling from 2.0 V toward 0.8 V. As the input voltage falls below 2.0 V, PMOS 200 starts conducting more strongly and the gate drive to NMOS 202 reduces. As a result, the voltage at node 204 begins to rise. With the voltage at node 208 follows the rise of the voltage at node 204, PMOS 210 begins to conduct, raising the output voltage $V_{out}$ as it moves up. In this fashion, as the input voltage continues to fall, the output voltage continues to rise. When the input voltage $V_{in}$ falls below 1.0 V (Vtn), both NMOS 202 and NMOS 212 turn off, with the buffer at a zero current state. This region correspond to time period E in FIG. 3.

Therefore, since the second stage of the level converting circuit of the present invention does not consume standby current when the input voltage is at or below 0.8 V, or at or above 2.0 V, it is possible to scale up the transistors of the second stage to drive a very large fanout capacitance. The only stage which consumes standby current is the first inverter. For higher speed operation, the first stage inverter can be made as large as the power requirements allow. A faster first stage reduces the delay in driving the gate terminal of depletion NMOS 206.

The circuit of the present invention also takes advantage of the fact that, as a signal that is external to the chip, the TTL input signal must be strong enough to drive several picofarads associated with an input pin on an integrated circuit package. Therefore, lumping the gate capacitances of input transistors 200, 202, 208, and 212 (totalling to no more than several thousandths of a picofarad) at $V_{in}$ (which connects to an input pin) will not adversely affect the circuit performance.

Figure 4:
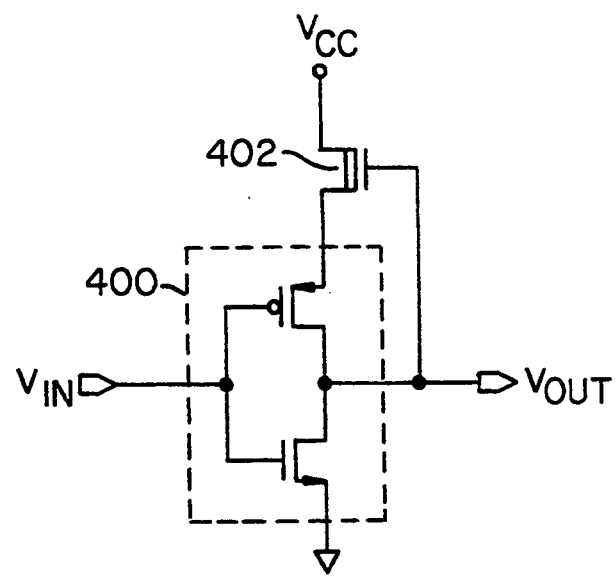
FIG. 4 is a circuit schematic of another embodiment of the level converting circuit according to the present inventions.

In another embodiment, the present invention provides a zero-current version of the voltage level converting circuit. FIG. 4 is a circuit schematic of the second embodiment of the level converting circuit of the present invention. The circuit of FIG. 4 is a single stage buffer circuit comprising a CMOS inverter 400 that connects to the power supply $V_{cc}$ through a depletion NMOS 402. The gate of depletion NMOS 402 is driven by the output $V_{out}$ of the buffer circuit.

The operation of the buffer circuit of FIG. 4 is similar to the second stage of the buffer circuit of FIG. 2. Depletion transistor 402 disconnects inverter 400 from the power supply $V_{cc}$ when the input voltage ranges between 2.0 V and $V_{cc}$. Therefore, this circuit has zero standby current similar to the second stage of the buffer circuit in FIG. 2. However, because the gate terminal of depletion NMOS 402 is driven by the output $V_{out}$, this circuit is slower. This is so because when driving a large capacitive load, the output node $V_{out}$ is significantly slower than node 204 in FIG. 2. This embodiment of the level converting circuit of the present invention is desirable when zero standby current is required.

Figure 5:
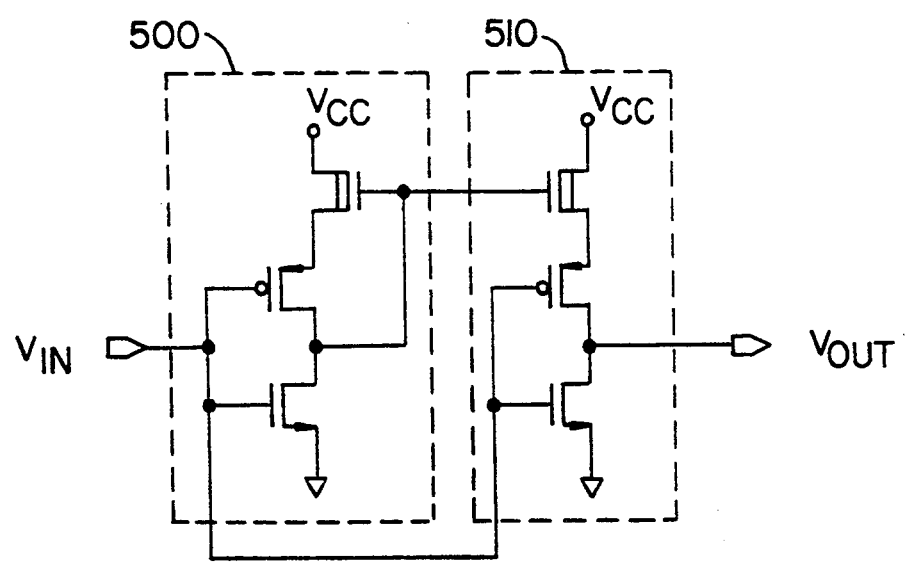
FIG. 5 is a circuit schematic of another embodiment of the level converting circuit according to the present invention.

A third embodiment of the present invention combines the first and the second embodiments. As shown in FIG. 5, this embodiment uses the single stage buffer of FIG. 4 as the first stage inverter in the buffer of FIG. 1 (i.e. in place of NMOS 200 and PMOS 202). Since neither of the two stages 500 and 510 dissipate any power, this circuit is also a zero-current buffer as in the circuit of FIG. 4. However, the circuit of FIG. 5 is comparatively faster than the single stage zero-current buffer circuit of FIG. 4.

In conclusion, the present invention provides three embodiments for an improved level converting circuit. The first preferred embodiment provides a fast level converting circuit that can drive large capacitive loads at reduced standby currents. The second embodiment provides a level converting circuit that is slower as compared to the circuit of the first embodiment but consumes zero standby power. A third embodiment provides a combination of the first and the second embodiments for a faster buffer circuit with a true zero standby current.

While the above is a complete description of the preferred embodiments of the present invention, it is possible to use various alternatives, modifications and equivalents. For example, instead of a depletion NMOS transistor used as the debiasing element in all three embodiments, an enhancement NMOS transistor can be used. A circuit with enhancement NMOS transistor as the debiasing element would enjoy similar improvements in power dissipation and speed. However, such a circuit would have limited voltage swing at the circuit output. Therefore, the scope of the present invention should be determined not with reference to the above description but should, instead, be determined with reference to the appended claims, along with their full scope of equivalents.

What is claimed is:

1. A voltage level converting circuit in a complementary metal-oxide-semiconductor (CMOS) process having depletion mode transistors, said circuit having an input and an output and coupled between a power supply terminal and ground, comprising:
   a first enhancement mode CMOS inverter having a PMOS transistor smaller in size than an NMOS transistos, and connected between the power supply terminal and ground, having an input connected to the circuit input and an output;
   a debiasing depletion mode transistor connected between the power supply terminal and a first node, with a gate terminal connected to the output of the first enhancement mode CMOS inverter; and
   a second enhancement mode CMOS inverter connected between the first node and ground, having an input connected to the circuit input and an output coupled to the circuit output,
   wherein, the depletion mode transistor operates to debias the second enhancement mode CMOS inverter to reduce power consumption.

2. A voltage level converting circuit in a complementary metal-oxide-semiconductor process having depletion mode transistors, said circuit having an input and an output, comprising:
   a first CMOS inverter having a PMOS transistor smaller in size than an NMOS transistor, with an input and an output, the first CMOS inverter input connecting to the circuit input;
   a first debiasing depletion mode transistor, connected between the first CMOS inverter and a power supply and driven by the first CMOS inverter output, for debiasing the first CMOS inverter into a zero current state;
   a second CMOS inverter with an input and an output, the second CMOS inverter input connecting to the circuit input; and
   a second debiasing depletion mode transistor, connected between the second CMOS inverter and the power supply and driven by the first inverter output, for debiasing the second CMOS inverter into a zero current state.

3. A voltage level converting circuit built in a complementary metal-oxide-semiconductor (CMOS) fabrication process that includes enhancement as well as depletion mode transistors, the circuit having an input and an output, and coupled between a power supply terminal and ground terminal, comprising:
   a first NMOS enhancement mode transistor of a first size and having a gate terminal connected to the input of the circuit, a source terminal connected to the ground terminal, and a drain terminal;
   a first PMOS enhancement mode transistor of a second size smaller than said first size and having a gate terminal connected to the input of the circuit, a source terminal connected to the power supply terminal, and a drain terminal connected to said drain terminal of said first NMOS enhancement mode transistor;
   a second NMOS enhancement mode transistor having a gate terminal connected to the input of the circuit, a source terminal connected to ground, and a drain terminal connected to the output of the circuit;
   a second PMOS enhancement mode transistor having a gate terminal connected to the input of the circuit, a drain terminal connected to the output of the circuit, and a source terminal; and
   a depletion mode transistor having a gate terminal connected to said drain of said first NMOS enhancement mode transistor, a source terminal connected to the power supply terminal, and a drain terminal connected to said source of said second PMOS enhancement mode transistor,
   wherein, the depletion mode transistor operates to debias the second PMOS enhancement mode transistor into a non-conducting cut-off region to reduce power consumption.

* * * * *